(12) United States Patent
Agraffeil

(10) Patent No.: US 9,337,039 B2
(45) Date of Patent: May 10, 2016

(54) METHOD FOR ELECTRICAL ACTIVATION OF DOPANT SPECIES IN A GAN FILM

(71) Applicant: COMMISSARIAT A L'ENERGIE ATOMIQUE ET AUX ENERGIES ALTERNATIVES, Paris (FR)

(72) Inventor: Claire Agraffeil, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/314,333

(22) Filed: Jun. 25, 2014

(65) Prior Publication Data

US 2015/0011080 A1    Jan. 8, 2015

(30) Foreign Application Priority Data

Jul. 3, 2013  (FR) ...................................... 13 56481

(51) Int. Cl.
| | |
|---|---|
| *H01L 21/225* | (2006.01) |
| *H01L 21/324* | (2006.01) |
| *H01L 21/265* | (2006.01) |
| *H01L 33/00* | (2010.01) |

(52) U.S. Cl.
CPC ...... *H01L 21/2258* (2013.01); *H01L 21/26546* (2013.01); *H01L 21/3245* (2013.01); *H01L 33/0062* (2013.01); *H01L 33/0095* (2013.01)

(58) Field of Classification Search
CPC ..................... H01L 21/2258; H01L 21/26546; H01L 21/3245; H01L 33/0062; H01L 33/0095
See application file for complete search history.

(56) References Cited

U.S. PATENT DOCUMENTS

| | | | |
|---|---|---|---|
| 6,221,684 B1 * | 4/2001 | Sugawara et al. | 438/47 |
| 2007/0161214 A1 * | 7/2007 | Fompeyrine et al. | 438/483 |
| 2010/0133656 A1 * | 6/2010 | Hager et al. | 257/615 |
| 2012/0119336 A1 * | 5/2012 | Akiyama | 257/629 |
| 2012/0238074 A1 * | 9/2012 | Santhanam et al. | 438/468 |
| 2013/0056793 A1 * | 3/2013 | Srinivasan | 257/183 |

FOREIGN PATENT DOCUMENTS

WO    WO 2006033041 A1 *  3/2006

OTHER PUBLICATIONS

Niiyama et al., "Si Ion Implantation into Mg-Doped GaN for Fabrication of Reduced Surface Field Metal-Oxide-Semiconductor Field-Effect Transistors," *Japanese Jounal of Applied Physics*, 2008, vol. 47, No. 7 pp. 5409-5416.
Hager et al., "Implant Activation in GaN Using an AlN Cap," *Army Research Lab*, Dec. 12, 2007, www.ecu.umd.edu/ISDRS.
Matsunaga et al., "Silicon implantation in epitaxial GaN layers: Encapsulant annealing and electrical properties," *Journal of Applied Physics*, Mar. 1, 2004, vol. 95, No. 5, pp. 2461-2466.
Aluri et al., "Microwave annealing of Mg-implanted and in situ Be-doped GaN," *Journal of Applied Physics*, 2010, vol. 108, pp. 083103-1-083103-7.
Jan. 23, 2014 French Search Report and Written Opinion issued in French Application No. 1356481 (with partial translation of Search Report).

* cited by examiner

*Primary Examiner* — John P Dulka
(74) *Attorney, Agent, or Firm* — Oliff PLC

(57) ABSTRACT

The method includes the steps of a) Providing a stack having a support substrate and a film of GaN having dopant species, b) Directly bonding a shielding layer having a thickness higher than 2 micrometers to the surface of the film of GaN, so as to form an activation structure, and c) Applying a thermal budget to the activation structure according to conditions allowing to electrically activate at least one portion of the dopant species.

13 Claims, 2 Drawing Sheets

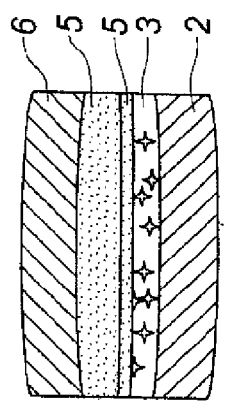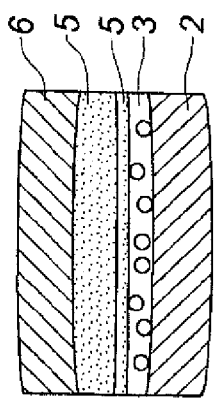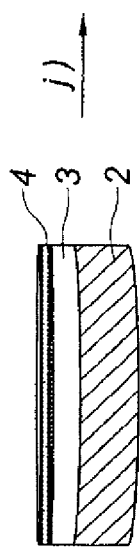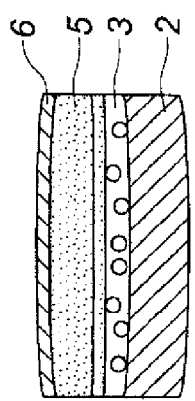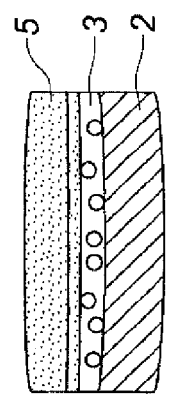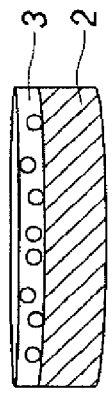

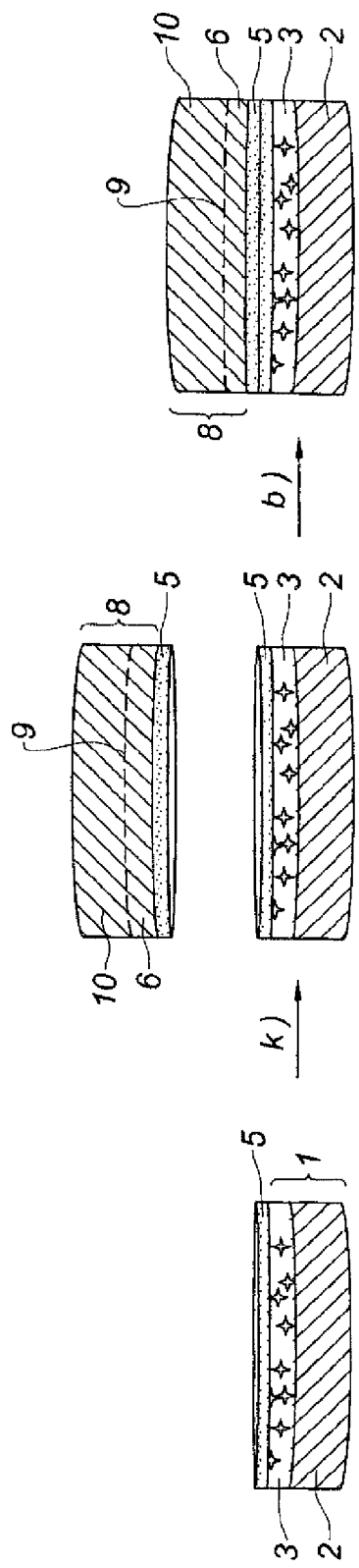
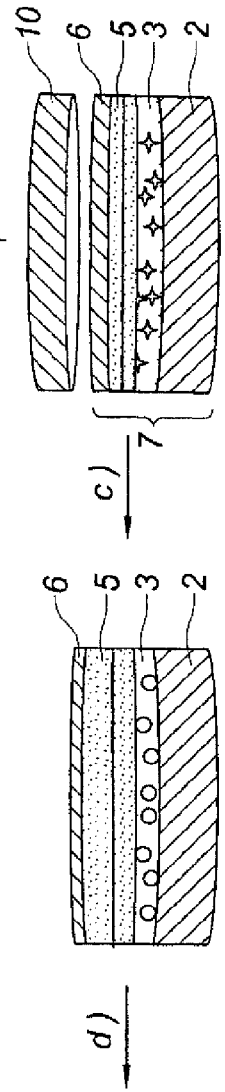

METHOD FOR ELECTRICAL ACTIVATION OF DOPANT SPECIES IN A GAN FILM

The present invention relates to a method for electrical activation of dopant species in a GaN film.

The GaN is a semiconductor material having a large band gap. It is thus advantageously used in the field of optoelectronics (LED) and high electron mobility transistors (HEMT). The value of its band gap (3.43 eV at 300K), its high critical field ($3.3.10^6$ V·cm$^{-1}$) and the high mobility of its electrons ($3.10^7$ cm·s$^{-1}$) makes the GaN be a material with great potential for applications in power microelectronics. However, some key steps of preparing the material, such as the doping by implantation, still must be controlled. Indeed, The GaN is a material which is sensitive to thermal treatments performed at high temperature, such as those required for the electrical activation of implanted dopants. This thermal instability is related in particular to the fact that nitrogen molecules evaporate from the GaN and lead to the decomposition of the material from approximately 850° C.

But the activation of dopants such as Mg, Zn, Ca (p-type dopants) or the Si, Ge, O (n-type dopants) requires the application of a thermal treatment at temperatures higher than 1000° C. It was then proposed to deposit protective layers (cap-layer) on the surface of the GaN layer in order to avoid the evaporation of nitrogen. These protective layers are generally constituted of SiO2, Si3N4 or of AlN and are deposited by techniques such as deposition by PVD (Physical Vapor Deposition), PEVCD (Plasma Enhanced Vapor Chemical Deposition), by spraying, by pulsed laser (PLD), or by epitaxy particularly in the case of the AlN, on a thickness ranging from several nanometers to about 1 micrometer. But these protective layers have not yielded completely satisfactory results. Beyond a certain temperature and/or a certain time period of thermal treatment, the protective layer deteriorates or delaminates from the GaN layer. This is mainly due to the difference of lattice parameter between the GaN and the deposited material and of the nitrogen release due to the decomposition of the GaN and to the poor quality of the protective layers deposited at low temperatures (typically below 800° C.). Moreover, the obtained GaN surface is often strongly roughened due to the nitrogen evaporation. In order to minimize the occurrence of such drawbacks, the time period or the temperature of the activation thermal treatment is reduced so that the electrical activation of the dopants is limited.

There exists therefore a need to provide a method configured to activate dopant species in the GaN which overcomes at least one of the aforementioned drawbacks. To this end, the present invention proposes a method for electrical activation of dopant species in a GaN film comprising the steps consisting of:
a) Providing a stack comprising a support substrate and a GaN film comprising dopant species,
b) Bonding by direct bonding a shielding layer having a thickness higher than 2 micrometers on the surface of the GaN film, so as to form an activation structure and
c) Applying a thermal budget to said activation structure according to conditions allowing to electrically activate at least one portion of said dopant species.

It is meant in the present document by the expression 'direct bonding', a direct bonding without interposition of adhesive material, binder or glue. But it is meant in the present document that the 'direct bonding' sometimes referred to as 'bonding by molecular adhesion' or 'molecular bonding' is generated by a direct contact or an indirect contact of the shielding layer and of the GaN film. It is in fact possible to insert one or more other separate layer(s), such as a bonding layer facilitating the bonding between the shielding layer and the GaN film.

By electrically activating at least one portion of the dopant species we mean that at least one portion of the dopant species is positioned in a gallium site of the GaN crystal (substitutional site). The rate of activated dopant species can be highly variable to observe a significant effect in the material. Thus, it is sufficient that 1% to 20% of the implanted species are activated in the case of an Mg implantation (typically in the order of 1% to 5%). For a silicon dopant, it will be necessary to activate at least 90% of the implanted silicon. If the doping is performed during the GaN film epitaxy (and not a doping obtained by subsequent implantation), 100% of the dopant species can be activated.

Thus, due to the method of the invention, it is possible to apply a thermal budget adapted to the activation of the ionic species while limiting the deterioration of the GaN layer. Indeed, the direct bonding brings a mechanical strength of enhanced binding between the shielding layer and the GaN film compared to the mechanical strength of the binding obtained by depositing a layer on the GaN film. Thanks to the present invention, the conditions for causing the delamination of the shielding layer are more drastic to achieve. It is thus possible to increase the activation thermal budget without risking the delamination compared to the activation thermal budget applicable with a deposited layer.

In addition, the direct bonding of a shielding layer allows to select a significant layer thickness, which is not the case when depositing the layer, particularly due to the difference in lattice parameter. Yet, it has been noticed that, for a shielding layer thickness typically higher than 2, even 5 or 10 micrometers and of a good crystalline quality, the risks of delamination are significantly reduced. But such thicknesses are difficult to achieve by deposition and this with a satisfactory crystalline quality. The deposition must in fact be carried out at a temperature compatible with the presence of the GaN (typically around 800° C.), which does not allow to obtain layers of good crystalline quality.

According to one arrangement, step c) of applying the thermal budget comprises applying at least one thermal treatment at a temperature higher than 1000° C., and even higher than 1200° C. for a time period ranging from several minutes to several days. It is particularly possible to go above these temperatures, for example up to 1300° C., even 1350° C. with a silicon support substrate and up to 1600° C. with a sapphire support substrate with a very short thermal treatment time period in this case.

It is understood that the conditions for applying the thermal budget depend on the nature of the dopant species to be activated, on their concentration in the GaN film and on the expected electrical properties of the doped GaN. In the case of the dopant species of silicon for example, the time period of the activation thermal treatment may be of 5 min at 1250° C. This will activate more than 90% of the dopants. In the case of dopant species of magnesium, thermal treatment may be of 48 hours at 1250° C. to allow the activation typically of 5% of the dopants.

According to an alternative, step c) of applying the thermal budget comprises applying several sequences of thermal treatments, each sequence being carried out at an identical or variable temperature and on an identical or variable time period. The Applicant could in fact observe that the fact of repeating the sequences allowed to increase the total applied thermal budget. Four cycles of 4 h at 1100° C. were thus able to be performed without deterioration of GaN.

Preferably, the method comprises, prior to step a), a step i) consisting of carrying out an epitaxy of the GaN film on the support substrate. This allows to obtain crystalline GaN, and even monocrystalline GaN, with few defects. This crystalline quality allows thereafter to optimize the performances of the devices or electronic components formed from this film.

According to one possibility, the doping is carried out during step i) of epitaxy.

Typically, the method comprises, prior to step a), a step k) consisting of diffusing dopant species in the GaN film.

According to another possibility, the method comprises, prior to step a), a step j) consisting of implanting dopant species in the GaN film. This allows to obtain a localized doping favorable to the subsequent manufacture of devices or electronic components. This also allows (unlike doping during epitaxy) to easily perform doping areas of opposite types (n and p) at locations localized according to the device to be carried out at this location. For this, we may carry out the implantation for example through different masks. The species (n and p) can then be activated simultaneously.

The dopant species may be n-type or p-type such as respectively silicon for the n-doping or for the p-doping of magnesium, Ca, Be or a co-implantation of Mg with P, Ca, 0 or N. The implantation can be carried out by any industrial implanter operating at room temperature, at low (typically around −15° C.) or high temperature (up to 500° C.) depending on the nature of the dopants. The implantation parameters, such as the energy and the implanted dose are defined by the final desired electrical properties. The energy is a function of the desired implantation depth. Typically for an implantation of Mg or Si, the energy may be in the range of 200 keV to obtain an implantation depth of about 400 nm. The dose may be around $2\times10^{15}$ at/cm$^2$ for Mg or Si to obtain a satisfactory electrical signature n or p for the production of electronic components or devices.

According to an alternative, step j) of implantation comprises an implantation of both n-type and p-type dopants.

Preferably, the material of the support substrate has a thermal expansion coefficient similar to that of the material of the shielding layer so that the structure can undergo the activation annealing at high temperature (typically around 1200° C. and even beyond) without risk of breakage.

Advantageously, the material of the support substrate is identical to the shielding layer. This embodiment allows to limit the occurrence of constraints through contraction or expansion differences during the temperature variations exerted on the activation structure. Thus, the risks of embrittlement of the shielding layer are limited. The adhesion of the shielding layer is not weakened so that the risk of delamination of the shielding layer is reduced.

In one particular arrangement, the support substrate is made of sapphire and the shielding layer is made of sapphire or alumina. In this case, the thermal treatment for activating the dopants is advantageously carried out between 1400 and 1600° C.

According to another arrangement, the support substrate is made of silicon and the shielding layer is made of silicon or of glass (if the latter includes a CTE adapted with the thermal budget to apply). In this case, the thermal treatment for activating the dopants may be carried out between 1000° C. and 1350° C. and advantageously between 1000° C. and 1250° C.

Preferably, the shielding layer is made of a crystalline material. The crystalline material having a better thermal resistance than a non-crystalline material, the risk of damage of the shielding layer is then limited during the application of the thermal budget.

According to one possibility, the method comprises, prior to step c), a step consisting of depositing a bonding layer on the GaN film and/or on the shielding layer, the bonding layer comprising at least one material selected from the SiO2, Si3N4, AlN, Al2O3, and the amorphous Si.

This bonding layer interposed between the shielding layer and the GaN film surface allows to facilitate the direct bonding and the obtaining of a high bonding energy. It is understood that the term 'bonding layer' does not mean a layer of a material constituted of glue or other adhesive material but a layer facilitating the direct bonding.

Advantageously, the bonding layer comprises a layer of AlN and a layer of SiO2. In this case, the AlN layer serves advantageously as a barrier to the diffusion of contaminants. Indeed, at the temperatures of the thermal budget applied in step c) the elements contained in the shielding layer, for example in silicon, can diffuse to the GaN film. These elements can contaminate the GaN and alter its electrical properties especially in case of p-doping, the silicon of the shielding layer having diffused (n-dopant) coming to compensate the p-doping of the GaN layer.

According to one possibility, the method comprises, prior to step b) of bonding, a step k) consisting of implanting ionic species in a source substrate so as to create an embrittlement plane delimiting on either side thereof the shielding layer and a negative of the source substrate. This step k) allows to easily transfer a shielding layer of a thickness higher than 2 micrometers on the GaN film. Moreover, it is possible to recycle the negative of the source substrate, which allows to save money particularly when crystalline source substrates are used. It is understood that the implantation of the ionic species of embrittlement of the source substrate in step k) is carried out through the shielding layer which is then bonded on the GaN film to form the activation structure.

According to one possibility, the method comprises, prior to step b) of bonding, a step m) consisting of depositing a covering layer on the shielding layer, the covering layer comprising at least one material selected from the SiO2, Si3N4, AlN, Al2O3, and the amorphous Si.

This covering layer advantageously allows to increase the thickness of the shielding layer, for example with an inexpensive material, so as to increase its stiffness. This covering layer typically has a maximum thickness ranging from 5 to 10 µm. Compared to a deposition directly carried out on the GaN film, the deposition of the covering layer is facilitated (particularly if the shielding layer is made of silicon), thus a deposited layer of better crystalline quality is obtained, allowing to consider more important subsequent thermal budgets.

Advantageously, step m) of depositing a covering layer is performed between steps k) of implantation and b) of bonding. It is thus possible to obtain the transfer of a shielding layer thickened by the covering layer and having a thickness higher than 2 micrometers, for example from 5 to 10 micrometers without the need to use conditions for a very deep implantation which can be very expensive.

According to another possibility, the covering layer is bonded to the GaN film or the covering layer is deposited on the face opposite to the face of the shielding layer bonded to the GaN film. The resulting shielding layer thus exhibits an efficiency (in terms of barrier and protection in particular) and an improved stiffness.

According to an alternative, the covering layer can also be distributed on either side of the bonding interface between the shielding layer and the GaN film before bonding. All of the above alternatives concerning the covering layer being able to be combined.

Preferably, the method comprises, after step k) of implantation and step b) of bonding, a step n) consisting of applying a thermal treatment of fracture allowing to fracture the source substrate at the embrittlement plane.

According to one possibility, step n) of applying the thermal treatment of fracture is carried out concurrently with step c) of applying the thermal budget. Thus, the thermal treatments of fracture and of activation can be performed in the same furnace by applying a suitable temperature ramp.

According to one alternative, the shielding layer is a self-supporting layer, and preferably the shielding layer is a bulk substrate. By the term 'self-supporting layer' we mean a layer having a thickness such that its mechanical strength enables it to be handled, particularly without winding around itself. This thickness depends on the nature of the material. Generally a self-supporting layer has a thickness higher than 15 micrometers and advantageously higher than 50 micrometers.

By the term 'bulk substrate' we mean a substrate including a single material and having a thickness higher than 50 micrometers is meant, typically in the order of 750 μm as most of the substrates commercially available. The use of a bulk substrate in the method of the invention allows to take advantage of the commercially available substrates, which are inexpensive, and which do not require an important preparation before use.

Thus, according to the method of obtaining the shielding layer, it is possible to select a thickness higher than 2 micrometers, than 10 micrometers, than 20 or 100 micrometers or and even more. This allows to adapt the thickness of the shielding layer to the activation thermal budget of the dopant species.

According to a further arrangement, the method comprises, after step c) of applying the thermal budget, a step d) consisting of removing the shielding layer so as to expose the upper face of the doped GaN film. This method thus allows to obtain a GaN film ready to be used, in particular for applications in power microelectronics and in optoelectronics.

Advantageously, the method comprises, after step d), a step e) consisting of manufacturing electronic components or devices from the GaN film doped for applications in the field of optoelectronics or power devices.

Other aspects, objectives and advantages of the present invention will be more apparent when reading the following description of two embodiments thereof, given by way of non-limiting examples and made with reference to the accompanying drawings. The figures do not necessarily meet the scale of all the elements shown to improve their readability. Dotted lines are used on the figures in order to illustrate an embrittlement plane. In the following description, for the sake of simplicity, identical, similar or equivalent elements of the different embodiments bear the same numeral references.

FIGS. 1 to 7 illustrate steps of a method for activation of dopant species according to a first embodiment of the invention.

FIGS. 8 to 14 illustrate steps of a method for activation of dopant species according to a second embodiment of the invention.

FIG. 1 illustrates the first step of the method consisting of providing a stack 1 comprising a support substrate 2 and a GaN film 3 (step a). The support substrate 2 is a bulk substrate made of sapphire and on which a film 3 of monocrystalline GaN was epitaxially deposited on a thickness of approximately 1 micrometer (step 1). It is possible to provide before the GaN epitaxy, the epitaxy of a buffer layer (usually called buffer layer) for example in AlGaN (for example of a thickness of 1 μm) to facilitate management of the lattice parameter difference and thus increase the breakdown voltage of the subsequently formed electronic components or devices. Then, before proceeding to the step of implanting dopant species, an optional step of surface preparation is first performed, such as a step of cleaning with a NH4OH/H2O solution at 60° C. or with a dilute solution of HF, or a step of deoxidation of the GaN surface. A protective layer 4 is then deposited on the surface of the GaN film 3 to limit the occurrence of crystalline defects generated by the implantation of the dopants and especially to limit the channeling effects during the ionic implantation by promoting a random distribution of the dopants. This protective layer 4 is typically composed of silicon oxide, silicon nitride, AlN, alumina or amorphous silicon.

FIG. 2 illustrates a step consisting of implanting dopant species such as Mg with a dose of $2.10^{15}$ at/cm$^{-2}$ in the film 3 of GaN (step j). This implantation can be carried out in any type of implanter and particularly the industrial implanter of NV8200 type available from the manufacturer Axcelis.

Of course, the implantation conditions vary according to the final expected electrical properties of the GaN.

A cleaning step and optionally of CMP (chemical-mechanical polishing) of the surface is preferably performed before depositing a bonding layer 5, such as a layer of SiO2 or of silicon nitride. We also proceed to an optional plasma treatment to activate the exposed surface and promote the bonding.

As illustrated in FIG. 3, a sapphire substrate is placed in contact with the GaN film 3 for direct bonding via a bonding layer 5 deposited on the film 3 as on the sapphire substrate. The sapphire substrate being crystalline and thick, forms a shielding layer 6 efficient for the protection of the GaN film 3 during the application of the activation thermal budget. Once the direct bonding carried out, an activation structure 7 able to withstand a thermal treatment of electrical activation of Mg dopant species (step c) is thus obtained.

It should be noted that the sapphire substrate was able to undergo a prior preparation, such as a cleaning typically comprising a treatment of RCA type and a plasma activation treatment of its surface prior to step b) of bonding.

Thus, the thermal expansion coefficient of the support substrate 2 is identical to that of the shielding layer 6 composed of the same material. The risks of damage to the activation structure 7 by delamination or of the creation of defects in the materials of the different layers by expansion difference during applied temperature changes are thus reduced.

FIG. 4 illustrates step c) of the method consisting of applying a thermal budget to the activation structure 7 at about 1400° C. for 30 minutes in order to electrically activate approximately 1 to 10% of the implanted magnesium.

The sapphire shielding layer 6 is removed to release film surface 3 of the p-doped GaN for the manufacture of devices (step d). The sapphire substrate 6 is first removed partly by a rectification step, in particular until reaching a thickness of about 20 micrometers (FIG. 5). Then a selective wet etching of the remaining sapphire is carried out, for example by using TMAH (TetraMethylAmmonium Hydroxide) which allows to stop the etching at the bonding layer 5 of SiO2 (FIG. 6). Then a wet etching with a dilute HF solution is carried out so as to remove all of the bonding layer 5 of SiO2 and expose the surface of the film 3 of p-doped GaN (FIG. 7). Other techniques are possible, in particular through lift off, blade insertion or laser lift off.

According to a non illustrated alternative, the bonding layer 5 deposited on the GaN film 3 before contact with the shielding layer 6, comprises a diffusion barrier layer for example of AlN to avoid eventual diffusion of contaminating species.

FIGS. 8 to 14 illustrate a second embodiment of the method for application of the thermal treatment. FIG. 8 shows a stack 1 composed of a silicon support substrate 2 and a film 3 of GaN in which dopant species of silicon were implanted. A bonding layer 5 of SiO2 was deposited on the surface of the film 3 for the bonding with a shielding layer 6.

FIG. 9 illustrates a step k) of implanting ionic species, such as hydrogen, with an energy of 200 KeV and a dose ranging from $10^{16}$ to $10^{17}$ at/cm$^2$, in a silicon source substrate 8 in order to form an embrittlement plane 9 delimiting a shielding layer 6 of about 2 micrometers and a negative 10 of the source substrate 8. As is well known in the prior art, different surface preparation steps as well as a protective layer 4 were carried out before proceeding to the implantation. It is understood that the implanted ionic species crossed the shielding layer 6 in order to form the embrittlement plane 9 at a depth of the source substrate 8 determined among others by the implantation energy.

A bonding layer 5, for example of SiO2 is deposited on the source substrate 8 weakened before performing step b) of direct bonding with the GaN film 3 (FIG. 10).

Then a thermal treatment of fracture is carried out at a temperature ranging from 400° C. to 500° C., so as to detach the negative 10 from the shielding layer 6 (FIG. 11—step n).

The obtained activation structure 7 is thus subjected to thermal budget of electrical activation of the dopant in Si at 1200° C. for at least 30 minutes (FIG. 12—step c). An electrical activation of 70% and even of 100% of the dopant species is thus obtained.

Finally, the shielding layer 6 of silicon is removed partly by a rectification step, particularly until reaching a thickness of about 20 micrometers. Then a selective wet etching of the remaining silicon is carried out, for example by using TMAH (TetraMethylammonium Hydroxide) which allows to stop the etching at the bonding layer 5 of SiO2 (FIG. 13—step d). Then a wet etching with a dilute HF solution is carried out so as to remove all of the residual bonding layer 5 of SiO2 and expose the film 3 of n-doped GaN (FIG. 14).

According to an alternative of embodiment, not shown, a covering layer is deposited on the shielding layer 6 prior to step b) of bonding so as to increase the thickness and the stiffness of the shielding layer 6.

Thus, the present invention provides a decisive improvement to the state of the prior art by proposing a method for electrical activation of dopant species in a GaN film 3 which is effective and limits the damage of the surface of the obtained GaN film 3. This film 3 is then advantageously used in the manufacture of electronic components, optoelectronic devices or of power with improved performances.

The invention is not limited to the embodiments described above as examples, but it comprises all the technical equivalents and the alternatives of the described means as well as their combinations.

The invention claimed is:

1. A method for electrical activation of dopant species in a film of GaN wherein the method comprises the steps of:
   a) Providing a stack comprising a support substrate and a film of GaN comprising dopant species,
   b) Bonding by direct bonding a shielding layer having a thickness higher than 2 micrometers to the surface of the film of GaN, so as to form an activation structure, and
   c) Applying a thermal budget to said activation structure according to conditions configured to electrically activate at least one portion of said dopant species.

2. The method according to claim 1, wherein the step c) of applying the thermal budget comprises applying at least one thermal treatment at a temperature higher than 1000° C., and even higher than 1200° C., for a time period ranging from several minutes to several days.

3. The method according to claim 1, wherein step c) of applying the thermal budget comprises applying several thermal treatment sequences, each sequence being carried out at an identical or variable temperature and on an identical or variable time period.

4. The method according to claim 1, wherein the method comprises, prior to the step a), a step i) of carrying out an epitaxy of the film of GaN on the support substrate.

5. The method according to claim 4, wherein the film of GaN is doped during step i) of epitaxy.

6. The method according to claim 1, wherein the method comprises, prior to the step a), a step j) consisting of implanting the dopant species in the film of GaN.

7. The method according to claim 6, wherein the step j) of implantation comprises an implantation of both n-type dopants and p-type dopants.

8. The method according to claim 1, wherein the support substrate is composed of sapphire and the shielding layer is composed of sapphire or of alumina, or in that the support substrate is composed of silicon and the shielding layer is composed of silicon or of glass.

9. The method according to claim 1, wherein the shielding layer is composed of a crystalline material.

10. The method according to claim 1, wherein the method comprises, prior to the step b) of bonding, a step k) consisting of implanting ionic species in a source substrate so as to create an embrittlement plane delimiting either side thereof the shielding layer and a negative substrate of the source substrate.

11. The method according to claim 10, wherein the method comprises, after the step b) of bonding, a step n) consisting of applying a thermal treatment of fracture configured to fracture the source substrate at the embrittlement plane, the thermal treatment of fracture being carried out concurrently the with step c) of applying the thermal budget.

12. The method according to claim 1, wherein the method comprises, prior to the step b) of bonding, a step m) consisting of depositing a covering layer on the shielding layer, the covering layer comprising at least one material selected from SiO2, Si3N4, AlN, Al2O3, and an amorphous Si.

13. The method according to claim 1, wherein the method comprises, after the step c) of applying the thermal budget, a step d) consisting of removing the shielding layer so as to expose the upper face of the film of the doped GaN and after the step d), a step e) consisting of manufacturing devices from the film of doped GaN for applications in the field of optoelectronics or power devices.

* * * * *